US009735031B2

(12) United States Patent
Wang et al.

(10) Patent No.: US 9,735,031 B2
(45) Date of Patent: Aug. 15, 2017

(54) POLISHING COMPOSITIONS AND METHODS FOR POLISHING COBALT FILMS

(71) Applicant: Fujifilm Planar Solutions, LLC, North Kingstown, RI (US)

(72) Inventors: Luling Wang, Chandler, AZ (US); Abhudaya Mishra, Gilbert, AZ (US); Deepak Mahulikar, Kingstown, RI (US); Richard Wen, Mesa, AZ (US)

(73) Assignee: FUJIFILM PLANAR SOLUTIONS, LLC, North Kingstown, RI (US)

( * ) Notice: Subject to any disclaimer, the term of this patent is extended or adjusted under 35 U.S.C. 154(b) by 0 days.

(21) Appl. No.: 14/857,325

(22) Filed: Sep. 17, 2015

(65) Prior Publication Data
US 2016/0189976 A1 Jun. 30, 2016

Related U.S. Application Data

(62) Division of application No. 14/478,508, filed on Sep. 5, 2014.

(51) Int. Cl.
*B44C 1/22* (2006.01)
*C03C 15/00* (2006.01)
(Continued)

(52) U.S. Cl.
CPC ............ *H01L 21/3212* (2013.01); *C09G 1/02* (2013.01)

(58) Field of Classification Search
USPC .......................................................... 216/89
See application file for complete search history.

(56) References Cited

U.S. PATENT DOCUMENTS

| 4,615,875 A | * | 10/1986 | Gonczy | .................. | C01F 7/428 423/626 |
| 8,545,715 B1 | | 10/2013 | Wang et al. | | |
| 2002/0019128 A1 | | 2/2002 | Lee et al. | | |
| 2003/0064671 A1 | | 4/2003 | Pasqualoni et al. | | |

(Continued)

FOREIGN PATENT DOCUMENTS

CN 101928520 A 12/2010
JP 2011003665 A 1/2011
(Continued)

OTHER PUBLICATIONS

Extended Search Report dated Feb. 12, 2016 for European application No. 15175849.7.
(Continued)

*Primary Examiner* — Roberts Culbert
(74) *Attorney, Agent, or Firm* — Ohlandt, Greeley, Ruggiero & Perle, LLP

(57) ABSTRACT

The present disclosure relates to polishing compositions that can polish Cobalt (Co) films in semiconductor substrates containing a multitude of films including Co, metals, metal oxides and dielectrics. These polishing compositions comprise an abrasive, a weak acid acting as a removal rate enhancer (RRE), a pH adjuster, and an azole-containing corrosion inhibitor (CI). The RRE, pH adjuster and CI have a pKa in the 1-18 range ($1$ ($pKa_{min}$)<$pKa$<$18$ ($pKa_{max}$)). The pKa values of the individual components are related to the pH of the polishing composition/slurry ($pH_{slurry}$) by the following equation: $pKa_{min}+6<pH_{slurry}<pKa_{max}-6$. The polishing composition also has less than about 100 parts per million (ppm) of sulfate ions and less than about 100 ppm of halide ions, and operates in the 7-12 pH range.

17 Claims, 5 Drawing Sheets

(51) Int. Cl.
*C03C 25/68* (2006.01)
*C23F 1/00* (2006.01)
*H01L 21/321* (2006.01)
*C09G 1/02* (2006.01)

(56) References Cited

U.S. PATENT DOCUMENTS

| | | |
|---|---|---|
| 2004/0159050 A1 | 8/2004 | Pasqualoni et al. |
| 2007/0090094 A1 | 4/2007 | Thompson |
| 2013/0186850 A1* | 7/2013 | Wang .................. C09K 3/1463 216/13 |

FOREIGN PATENT DOCUMENTS

| JP | 2016017158 A | 2/2016 |
|---|---|---|
| KR | 1020140045891 A | 4/2014 |
| TW | 201336977 A | 9/2013 |
| WO | 2009056491 A1 | 5/2009 |
| WO | 2013112490 A1 | 8/2013 |

OTHER PUBLICATIONS

Japanese Office Action dated Sep. 20, 2016 for Japanese application No. 2015-174310.
Korean Office Action dated Dec. 19, 2016 for Korean application No. 1020150105191.
Chinese Office Action dated May 12, 2017 for Chinese patent application No. 201510552487.9.
European Office Action dated Mar. 20, 2017 for European patent application No. 15175849.7.

* cited by examiner

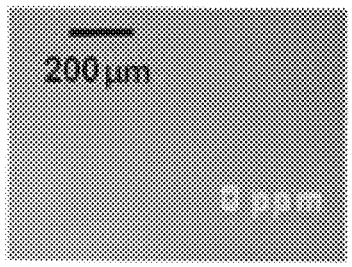 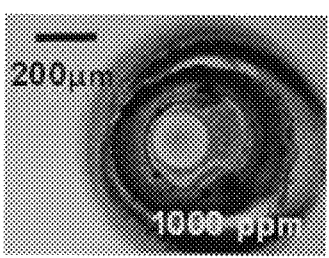 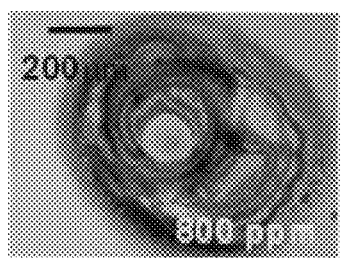
Fig. 3a    Fig. 3b    Fig. 3c
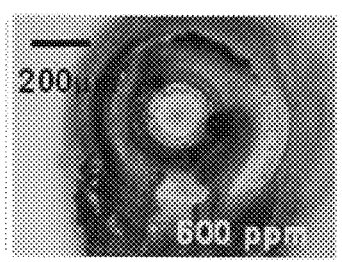 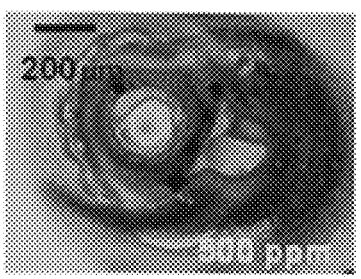 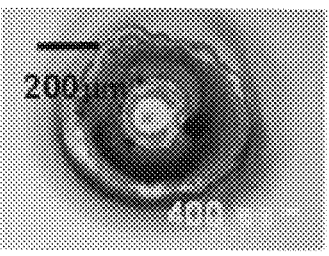
Fig. 3d    Fig. 3e    Fig. 3f
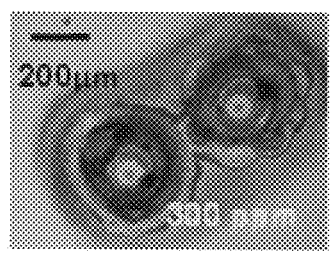 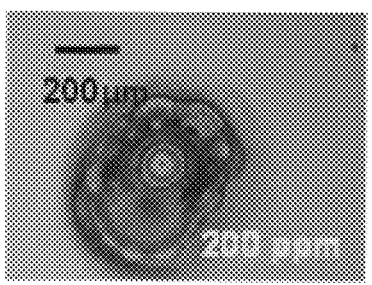 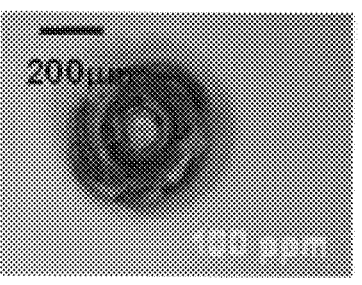
Fig. 3g    Fig. 3h    Fig. 3i

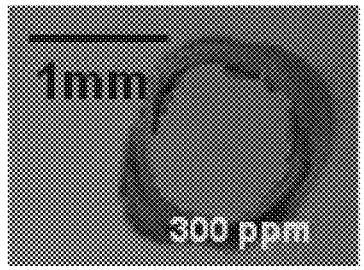 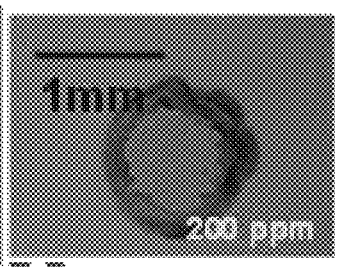 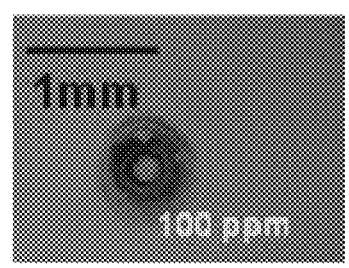
Fig. 4g  Fig. 4h  Fig. 4i
 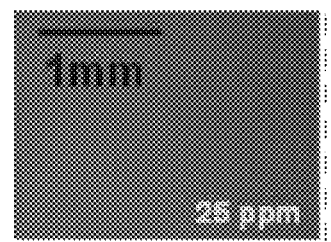
Fig. 4j  Fig. 4k
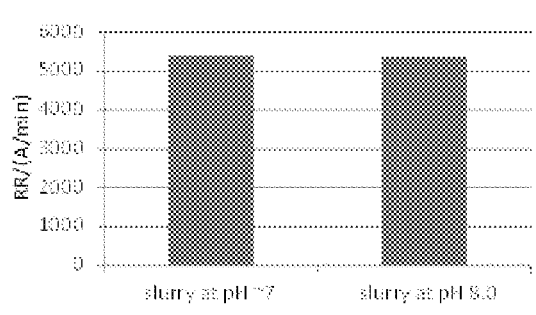 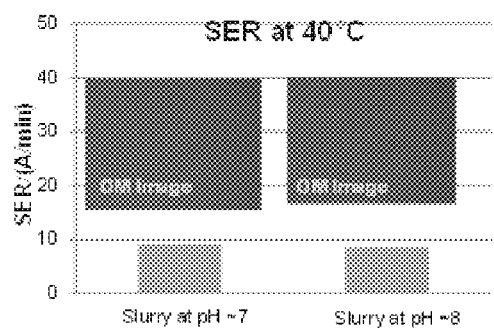
Fig. 5a  Fig. 5b

POLISHING COMPOSITIONS AND METHODS FOR POLISHING COBALT FILMS

CROSS-REFERENCE TO RELATED APPLICATION

The present application is a divisional of U.S. patent application Ser. No. 14/478,508, filed on Sep. 5, 2014, which is herein incorporated by reference.

BACKGROUND OF THE DISCLOSURE

1. Field of the Disclosure

The present disclosure relates to polishing compositions, and methods for polishing semiconductor substrates using the same. More particularly, this disclosure relates to polishing compositions and methods for polishing cobalt films with various rates and selectivities in semiconductor substrates containing multiple dielectric and metal films.

2. Description of the Related Art

The semiconductor industry is continually driven to improve chip performance by further miniaturization of devices by process, materials, and integration innovations. Earlier materials innovations included the introduction of copper, replacing aluminum as the conductive material in the interconnect structure, and the use of tantalum (Ta) (adhesion)/tantalum nitride (TaN) (barrier) to separate the Cu conductive material from the non-conductive/insulator dielectric material. Copper (Cu) was chosen as the interconnect material because of its low resistivity and superior resistance against electro-migration. However, as the features of the chip shrink, these multilayer Cu/barrier/dielectric stacks have to be thinner and more conformal to maintain effective interconnect resistivity in Back End of Line (BEOL). However, Cu and the Ta/TaN barrier film scheme present problems with resistivity and flexibility in deposition. With smaller dimensions and advanced manufacturing nodes, resistivity is getting so much exponentially worse that improvements in transistor circuit speed (at Front End of Line (FEOL)) are being cut in half by the delay coming from the conductive Cu/Barrier wiring (BEOL). Cobalt (Co) has emerged as a leading candidate for both the barrier layer as well as the conductive layer. Furthermore, cobalt is also being investigated as a replacement for tungsten (W) metal in multiple applications such as W metal contacts, plugs, vias, and gate materials.

Chemical Mechanical Polishing/Planarization (CMP) is a semiconductor fabrication process technology that is used to polish and planarize metals and dielectrics in BEOL and FEOL. For instance, for Cu CMP, the conductive Cu layer is polished and planarized until either the barrier layer or the insulator dielectric layer is exposed. The CMP process is performed by using a polishing composition (slurry) on a polishing tool that holds the wafers and presses it against a polishing pad. The concomitant application of chemistry (slurry) and mechanical forces (pressure) causes "Chemical Mechanical" polishing of the wafers. The end goal of the CMP step is to achieve local and global planarity post polishing along with a defect-free and corrosion-free surface. Some key metrics of the CMP slurry/process are Material Removal Rates (MRRs), surface defectivity post-polishing, and metal corrosion/etching prevention post-polishing.

With the introduction of Cobalt (Co) as a barrier layer, conductive layer, and/or W replacement, there is a market need for Co CMP slurries that can polish Co at high MRRs and have a range of selectivities in polishing rates of other metals and metal oxides (Cu, Ti, $Ta_2O_5$, $TiO_2$, $RuO_2$, etc.), and dielectric films (SiN, Silicon Oxide, P-Si, low k dielectrics, etc.). Because Co is more chemically reactive than Cu and other noble metals, Co corrosion prevention is very challenging in advanced nodes' slurry design. Current metal polishing slurries are ill-equipped to polish Co films as they suffer from Co corrosion issues in the CMP process. Thus, it is highly desirable to have Co slurries that can remove Co films while not causing Co corrosion.

FIGS. 1a and 1b display two Back End stack applications, as examples, in which Co slurries are needed. Each shows both a Co Bulk slurry (Co conductive layer), and a Co Barrier slurry (Co barrier layer). The application in FIG. 1a uses an additional metal oxide layer not needed for the application of FIG. 1b.

SUMMARY OF THE DISCLOSURE

The present disclosure provides CMP polishing compositions that are designed to polish and remove Co material. These polishing compositions display high Co Material Removal Rates (MRRs), good MRR selectivities with dielectric and barrier metal films, and superior defectivity and Co surface corrosion protection. With current polishing compositions, cobalt layers exhibit unsatisfactory corrosion.

More particularly, the present disclosure relates to a polishing composition comprising an abrasive, a weak acid acting as a removal rate enhancer (RRE), an azole containing Co corrosion inhibitor (CI), combinations of different azole CIs, and/or a pH adjustor. The RRE, CI, and the pH adjustor all have a pKa in the 1-18 range ($1<pKa<18$), and the polishing composition has a pH in the range of 7-12 ($7<pH<12$). The overall polishing composition has less than about 100 parts per million (ppm) of sulfate ions and less than about 100 ppm of halide (fluorine, chlorine, bromine or iodine) ions based on total weight of the polishing composition. This disclosure also discusses methods for polishing semiconductor substrates using the aforementioned polishing compositions.

The present disclosure provides a polishing composition that can polish cobalt with a high selectivity over other dielectric (such as silicon nitride, silicon oxide and polysilicon films), and barrier metal films. The present disclosure also provides a polishing composition that can polish cobalt films at very high material removal rates and produce surfaces with very low defectivity post polishing. The post CMP surfaces are also corrosion-free.

Thus, in one embodiment, the present disclosure provides a polishing composition for polishing cobalt containing material. The composition comprises an abrasive, a weak acid removal rate enhancer, an azole-containing corrosion inhibitor, and a pH adjuster. The removal rate enhancer, the corrosion inhibitor, and the pH adjuster each have a pKa between 1 and 18. The pH of the composition is between 7 and 12. The overall composition also has less than 100 ppm of sulfates, and less than 100 ppm of halides. The present disclosure also provides a method for polishing a substrate having cobalt on a surface thereof with the composition.

BRIEF DESCRIPTION OF THE DRAWINGS

FIGS. 3a-3k show corrosion images arising from sulfate ions from the raw materials or additives in polishing compositions, at varying concentrations.

FIGS. 4a-4k show corrosion images arising from chloride ions from the raw materials or additives in polishing compositions, at varying concentrations.

FIGS. 5a and 5b show material removal rates (MRRs) obtained using optimized polishing compositions containing a RRE and CI according to the present disclosure. The inserted images are optical images (OM) of Co wafers after etching with slurries at 40° C. for 5 min.

DETAILED DESCRIPTION OF THE DISCLOSURE

Figure 1A:
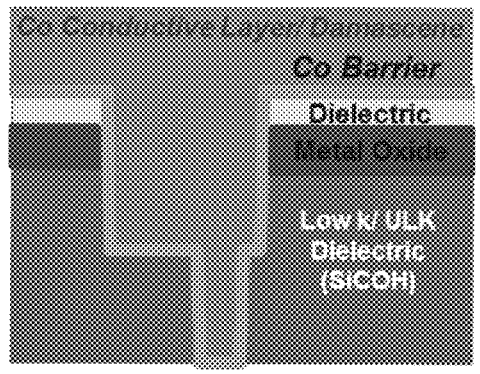
FIGS. 1a and 1b are schematic diagrams of Back End semiconductor stacks depicting the inclusion of Cobalt (Co); both as a conductive layer, and as a barrier layer.
Figure 1B:
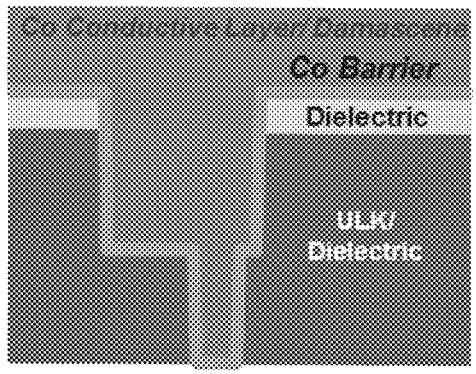

The composition of the present disclosure comprise an abrasive, a weak acid acting as a removal rate enhancer (RRE), at least one azole-containing cobalt (Co) corrosion inhibitor (CI), water, and/or a pH adjustor. The RRE, CI, and the pH adjustor each have a pKa in the 1-18 range (1<pKa<18). The polishing composition has a pH in the range of 7-12 (7<pH<12). Additionally, the composition of the present disclosure has less than 100 parts per million (ppm) of sulfate ions and less than 100 ppm of halide (fluorine, chlorine, bromine or iodine) ions, based on the total weight of the polishing composition.

The pKa of the RRE, CI, and pH adjustor, along with their associated concentrations, are critical in determining the pH of the slurry and therefore, the final CMP properties (MRRs and corrosion) of the polishing compositions (as discussed in greater detail below). Thus, the pH of the composition is governed by the pKa of the acidic and corrosion inhibitor components in the slurry such that pH of the slurry ($pH_{slurry}$) is related to pKa of the RRE and CI by the following equation:

$$pKa_{min}+6<pH_{slurry}<pKa_{max}-6 \quad (I)$$

As discussed above, the pKa of each of the RRE, CI, and the pH adjustor is from 1 to 18, or any subranges therebetween. The pKa can also be from 2 to 12, or any subranges therebetween, or from 2 to 10, or any subranges therebetween. The pH of the composition can be in the range of 7 to 12, or any subranges therebetween, from 7 to 10, or any subranges therebetween, or from 7 to 9, or any subranges therebetween.

As the weak acids and azole containing corrosion inhibitors have pKa in the range of 1 to 18 (in the broadest possible range), the resulting polishing compositions containing those RREs and CIs have an operating pH in the 7 to 12 pH range. The pKa is the logarithmic measure of the acid dissociation constant (Ka) of individual molecules, whereas the pH of the slurry is the logarithmic measure of the hydrogen ion [$H^+$] concentration in the slurry/solution. The RRE refers to the weak acid molecule that serves to enhance the material removal rates/polish rates of Co, and so is called removal rate enhancer (RRE). Furthermore, the corrosion inhibitor refers to the azole containing molecule that serves to prevent corrosion (or inhibit corrosion) on the Co film surface post polishing, and so is called "corrosion inhibit-or" (CI).

For the reasons discussed in greater detail below, compositions having the recited components, in the recited pKa ranges, governed by equation (I), and with the recited sulfate and halide impurity ranges, are found to be particularly well-suited for use in polishing Co.

Corrosion can be defined as degradation of the properties of a material as a result of chemical reaction with the environment. Co films have a different removal and subsequent surface passivation mechanism in different pH ranges, as governed by the Pourbaix Diagram for Cobalt. Co metal films have a native Co (II) containing oxide, CoO, on the surface, which is converted to $Co(OH)_2$ whenever the film comes in contact with any aqueous solution (for e.g., CMP slurry). This Cobalt (II) Hydroxide ($Co(OH)_2$) reacts differently in different pH ranges. This pH-dependent reaction kinetics and thermodynamics of Co films governs the film dissolution, removal, corrosion, and surface passivation post-polishing mechanisms of CMP polishing compositions, and is summarized in the Table 1 below.

TABLE 1

| Co films dissolution and passivation/corrosion behavior in pH 2-12. | | |
| --- | --- | --- |
| pH range 2-7 (Acidic) | pH = 7 (Neutral) | pH range 7-12 (Basic) |
| $Co(OH)_2 + 2H^+ \leftrightarrow Co^{2+} + 2H_2O$ | $Co(OH)_2 \leftrightarrow CoO + H_2O$ | $Co(OH)_2 + OH^- \leftrightarrow CoOOH + H_2O + e^-$ $3Co(OH)_2 + 2OH^- \leftrightarrow Co_3O_4 + 4H_2O + 2e^-$ $Co(OH)_2 + OH^- \leftrightarrow Co(OH)_3 + e^-$ |
| Co films dissolution rate—High | Film dissolution—High to Medium | Co films dissolution rate—Medium |
| Co Material Removal rates—High | Removal rates—High to Medium | Co Material Removal rates—Medium |
| Co surface passivation—Low | Co surface passivation—Low to Medium | Co surface passivation—High |

As can be seen from the table above, at a basic pH (pH of 7-12), the predominant passive films formed are Co(II)/Co (III) oxides and hydroxides ($Co(OH)_2$, $Co_3O_4$, CoOOH & $Co(OH)_3$). Note that in the acidic and near to neutral pH, Co (II) oxides and $Co^{2+}$ ions are the predominant passive films. Co (III) passive films are much more passive, i.e., non-reactive, than Co (II) passive films. Thus, the corrosion and etching rate protection post-polishing of Co (III) passivated films is much better than Co (II) films. This means that the polished Co surface will be more resistant to deleterious effects, such as the corrosion described above. Although the surface quality of Co films is the best in basic pH, this comes with the trade-off of lower material removal rates (MRRs)

during CMP, as depicted in Table 1. Thus, the present disclosure has determined that using weak acids as RREs, even if the overall MRRs are lower than with stronger acids, provides for better surface protection. In currently available slurries, one would likely not want to use weaker acids due to lower MRRs.

TABLE 2

Strong Acids (pKa < 0) that cause corrosion in Co slurry systems

| Acid Name | Acid Formula | Conjugate Base | pKa | Corrosion Inducing Agent |
|---|---|---|---|---|
| Chloric acid | $HClO_3$ | $ClO_3^-$ | −1 | Cl |
| Nitric acid | $HNO_3$ | $NO_3^-$ | −1.4 | N |
| Sulfuric acid | $H_2SO_4$ | $HSO_4^-$ | −3 | S |
| Hydrochloric acid | HCl | $Cl^-$ | −6 | Cl |
| Perchloric acid | $HClO_4$ | $ClO_4^-$ | −8 | Cl |
| Hydrobromic acid | HBr | $Br^-$ | −9 | Br |
| Hydroiodic acid | HI | $I^-$ | −10 | I |

The corrosion characteristics of the composition are also much improved by having a weak acid that does not cause any corrosion or does not have any corrosion inducing agent. Table 2 lists the strong acids, their pKa, and the corrosion inducing agent contained in them that causes corrosion of Co films. As can be seen from Table 2, all strong acids have some corrosion inducing agent and have pKa<0.

The present disclosure has determined that for Co slurry systems, one should refrain from using strong acids with pKa<0, as these cause corrosion on the post-polished surface. Thus, in the present composition, weak acids are used as RREs and all of these have pKa>0, as the pKa determines the pH of the slurry and the surface passivation/corrosion characteristics post polishing. However, one major issue that all CMP slurry vendors face is that there are trace metals and impurity ions coming from the raw materials used in making the slurry. As an example, although Hydrochloric acid (HCl with pKa<0) might not have been intentionally added in the composition, the RRE acid bulk chemical (for example, citric acid with pKa>0) used in making the slurry might have trace amounts of chloride (Cl) ions as impurity which gets introduced in the slurry once the RRE is used. These trace amounts of corrosion inducing agents introduced in the slurry as an impurity (and not intentionally added) can also cause corrosion on Co films. This intriguing behavior is depicted in Example 1 and FIG. 2. This is why the compositions of the present disclosure have less than 100 parts per million (ppm) of sulfate ions, and less than 100 ppm of halide ions, based on the total weight of the polishing composition. These ranges allow for impurities introduced accidentally, but exclude the deliberate introduction of strong acids with pKa values less than zero. The corrosion caused by sulfate and halide ions at higher levels is discussed below in Example 2, and seen in FIG. 3.

There are different kinds of corrosion behavior and mechanisms of corrosion for different metal containing films. Within the electronic materials industry, the main forms of corrosion encountered are general corrosion, pitting corrosion, galvanic corrosion, crevice corrosion and inter-granular corrosion. Furthermore, within the CMP industry, the three prevalent forms of corrosion/etching are general, pitting and galvanic corrosion. Thus, most traditional metal polishing slurries (like Cu, barrier metal, etc.) have some form of corrosion inhibitors in them to prevent primarily general corrosion. However, the introduction of "newer" metals such as Co for the conductive and barrier layer introduces new challenges and corrosion problems for the CMP industry. For CMP of Co films, pitting corrosion is the main form of corrosion. Although Co is a first row transition metal like Cu, in the Periodic Table, Co thin films are much more chemically "fragile" than Cu. This is advantageous from a polishing perspective as higher Material Removal Rates (MRRs) can be obtained for Co films. However, the big drawback for Co films for not being chemically inert is pitting corrosion post polishing.

Not surprisingly, with the integration of Co as a conductive as well as barrier layer for the latest technology node manufacturing, the biggest issue that the CMP community is facing is Co corrosion during or post-CMP. The present disclosure has found that the pKa of the removal rate enhancer (RRE) and the corrosion inhibitor (CI) are critical in determining the operating pH of the slurry and thus the corrosion properties displayed by the slurries. Thus, RREs and CIs are needed which have a pKa in the 1-18 range. Some examples of weak acid RREs with pKa in the 1-18 range are shown in Table 3. These work well for Co slurry systems and do not cause Co film corrosion post polishing.

TABLE 3

Weak Acids (pKa > 0; and 1 < pKa < 18) that DO NOT cause corrosion in Co slurry systems.
These are only some examples of RREs.

| Acid Name | Acid Formula | Conjugate Base | pKa | Corrosion Inducing Agent |
|---|---|---|---|---|
| Oxalic acid | $H_2C_2O_4$ | $HC_2O_4^-$ | 1.23 | None |
| Phosphoric acid | $H_3PO_4$ | $H_2PO_4^-$ | 2.12 | None |
| Citric acid | $C_6H_8O_7$ | $C_6H_7O_7^-$ | 3.08 | None |
| Lactic acid | $C_3H_6O_3$ | $C_3H_5O_3^-$ | 3.86 | None |
| Ascorbic acid | $C_6H_8O_6$ | $C_6H_7O_6^-$ | 4.10 | None |
| Benzoic acid | $C_7H_6O_2$ | $C_7H_5O_2^-$ | 4.19 | None |
| Acetic acid | $C_2H_4O_2$ | $C_2H_3O_2^-$ | 4.75 | None |
| Propionic acid | $C_3H_6O_2$ | $C_3H_5O_2^-$ | 4.88 | None |
| Phenol | $C_6H_6O$ | $C_6H_5O^-$ | 9.8 | None |
| Ethanol | $C_2H_6O$ | $C_2H_5O^-$ | 16 | None |

Furthermore, a list of azole containing CIs with pKa in the 1-18 range is depicted in Table 4. These CIs prevent Co film surface corrosion post polishing by acting as a strong Co corrosion inhibitor and binding to the Co films, and passivating the films post CMP. The synergistic use of the particular type of RRE and CI combination delivers corrosion free and defect free Co "CMP-ed" films, as is discussed later.

TABLE 4

Azole containing Corrosion Inhibitors (pKa > 0; and 1 < pKa < 18) that PREVENT Co corrosion in Co slurry systems.
These are only some examples of CIs.

| Corrosion Inhibitor Name | Formula | Conjugate Base | pKa | Corrosion Inducing Agent |
|---|---|---|---|---|
| Triazole | $C_2H_3N_3$ | $C_2H_2N_3^-$ | 2.2 | None |
| Aminotriazole | $C_2H_4N_4$ | $C_2H_3N_4^-$ | 4.4 | None |
| Tetrazole | $CH_2N_4$ | $CHN_4^-$ | 4.9 | None |
| Benzotriazole | $C_6H_5N_3$ | $C_6H_4N_3^-$ | 8.2 | None |
| Tolytriazole | $C_7H_7N_3$ | $C_7H_6N_3^-$ | 8.8 | None |
| Pyrazole | $C_3H_4N_2$ | $C_3H_3N_2^-$ | 14 | None |
| Imidazole | $C_3H_4N_2$ | $C_3H_3N_2^-$ | 14.5 | None |

The amount of abrasive in the composition of the present disclosure can be from about 0.05 to about 15 percent by weight, or any subranges therebetween, or from about 0.05 to about 10 percent by weight, or any subranges therebetween. The amount of RRE can be from about 0.1 to about 20 percent by weight, or any subranges therebetween, or from about 10 to about 15 percent by weight, or any subranges therebetween. The amount of CI is from about 0.05 to about 10 percent by weight, or any subranges therebetween, from about 0.05 to about 6 percent by weight, or any subranges therebetween, or from about 1 to about 3 percent by weight, or any subranges therebetween. When present, the amount of pH adjuster can be up to about 2 percent by weight, or any subranges between zero and 2 percent by weight. Unless otherwise indicated in the present specification, all weight amounts are percentage amounts, based on the total weight of the composition.

The abrasive of the present disclosure can be selected from the group consisting of alumina, silica, titania, ceria, zirconia, co-formed products thereof, coated abrasives, surface modified abrasives, and mixtures thereof. Specific examples of the RRE, which meet the above-described pKa requirements, can be gluconic acid, lactic acid, citric acid, tartaric acid, malic acid, glycolic acid, malonic acid, formic acid, oxalic acid, acetic acid, propionic acid, peracetic acid, succinic acid, lactic acid, potassium acetate, potassium citrate, amino acetic acid, phenoxyacetic acid, bicine, phosphoric acid, diglycolic acid, glyceric acid, tricine, alanine, histidine, valine, phenylalanine, proline, glutamine, aspartic acid, glutamic acid, arginine, lysine, tyrosine, benzoic acid, mixtures thereof, or salts thereof. Specific examples of the azole-containing CI, which meet the above-described pKa requirements, can be of triazole, tetrazole, benzotriazole, tolytriazole, aminotriazole, aminobenzimidazole, pyrazole, imidazole, aminotetrazole, and any mixtures thereof. Specific examples of the pH adjuster, which meet the above-described pKa requirements, can be a weak acid such as citric acid, tartaric acid, malic acid, glycolic acid, malonic acid, oxalic acid, acetic acid, propionic acid, potassium acetate, potassium citrate, or combinations thereof.

As previously discussed, CMP is defined as the concomitant application of chemistry (slurry) and mechanical forces (pressure) causing "Chemical Mechanical" polishing of the wafers containing the metal thin films. The chemistry is responsible for the chemical action (etching/corrosion), whereas the mechanical action comes from the abrasive and the tool polishing pressure. "Corrosion" in the CMP of metal films denotes a negative connotation, as it is generally referring to an end-result defect, such as pitting, staining, general corrosion and/or surface roughness. However, corrosion is also a necessary part of the metal material removal process in the form of mild etching. Without it, material removal by film dissolution would not occur or would occur in an extremely slow and irrational fashion. Corrosion is an oxidation process in which the metal (zero oxidation state) increases its oxidation state to a higher positive number. For e.g., Co films ($Co^0$) once corroded go to $Co^{2+}$ and/or $Co^{3+}$. This corrosion/oxidation of metal surface causes stress (as per Pilling-Bedworth ratio), and the stress consequently leads to enhanced dissolution rates of the metal films. However, if this dynamic corrosion/dissolution of the oxidized metal film is not controlled by the introduction of a corrosion inhibitor (CI) in slurry systems, and the "CMP-ed" surface is not passivated post polishing, the semiconductor device fails post production.

Thus, the synergistic combination of a limiting number of corrosion inducing agents such as sulfates and halides, along with abrasives, and the right pKa rate enhancers and corrosion inhibitors results in polishing compositions that give high cobalt material removal rates along with a corrosion and defect free surface. This will become evident from the examples and results discussed below.

EXAMPLES

Examples are provided to further illustrate the capabilities of the polishing compositions and methods of the present disclosure. The provided examples are not intended and should not be construed to limit the scope of the present disclosure.

Example 1

This example demonstrates that the impact of acid additives in a polishing composition on Co corrosion using static etching rate (SER) tests. This example discloses that in order to prevent Co corrosion, the acid additives in said polishing compositions need to have a pKa within the range of 1<pKa<18. A polishing composition containing strong acid additive (pKa<0) will cause Co corrosion.

In this example, the polishing composition primarily comprises 0.02-3 wt % abrasive, several acids as cobalt RRE, an azole containing corrosion inhibitor or combinations thereof, a weak acid as a pH adjuster and water as a liquid carrier. Polishing compositions with different acid additives were tested by 40° C. SER to check the corrosion performance. 40° C. SER tests were performed on ~2×2 cm Co coupons immersed in the polishing composition for 5 min. After SER, the Cobalt coupon was rinsed immediately with a lot of DI water and dried with nitrogen gas to clean the surface. The image of post-etched Co coupon surface was taken by Nikon Optical Microscope (made by Nikon Corporation, Japan) for Co corrosion investigation.

Figure 2A:
FIGS. 2a-2f display images of Co coupons etched by polishing compositions (slurries) containing different acid additives.
Figure 2B:
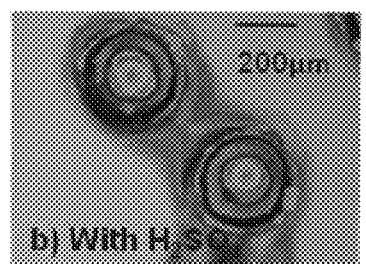
Figure 2C:
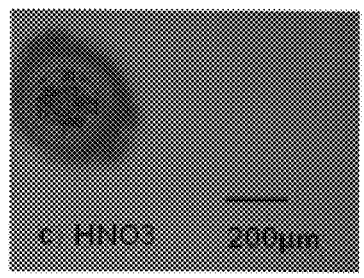
Figure 2D:
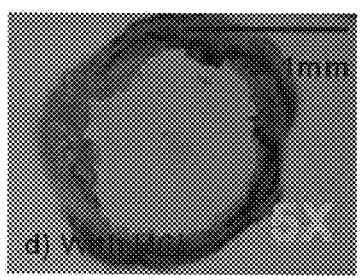
Figure 2E:
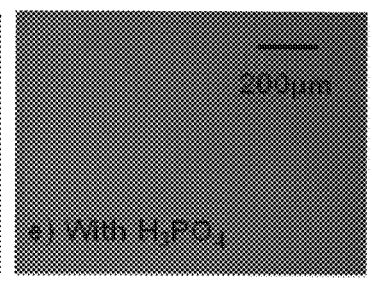
Figure 2F:
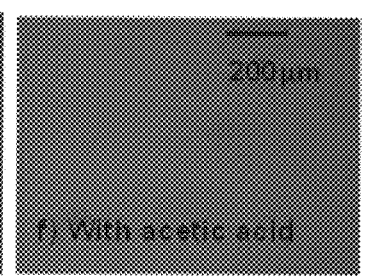
Figure 3J:
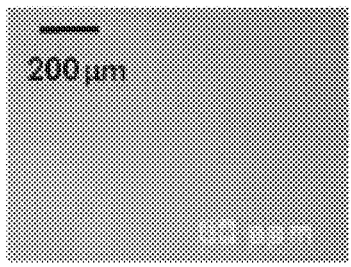
Figure 3K:
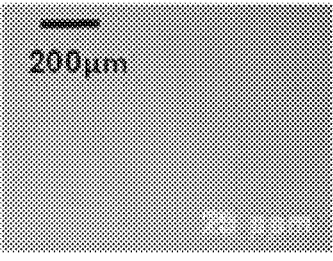
Figure 4A:
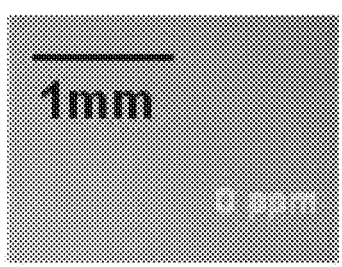
Figure 4B:
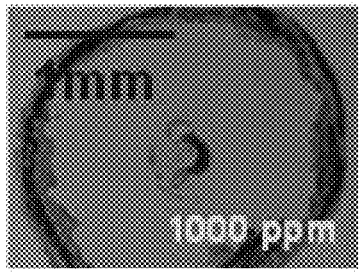
Figure 4C:
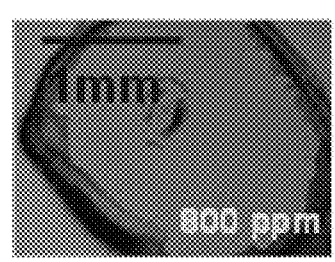
Figure 4D:
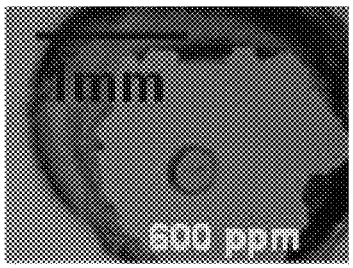
Figure 4E:
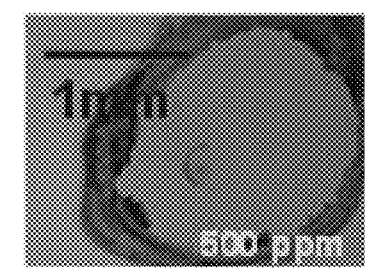
Figure 4F:
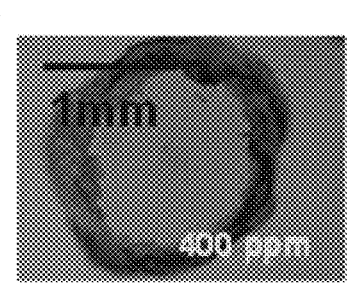

Table 5 lists Co corrosion results for polishing compositions containing 600 ppm of different acid additives. A brand new (virgin) blanket Co coupon was used as a control for comparison (FIG. 2a). FIGS. 2b-2f show images of Co coupons etched by polishing compositions (slurries) containing different acid additives as detailed in Table 2. All samples from 5E to 5J showed no Co corrosion, as the pKa of these RREs was in the 1-18 range. However, acids with pKa<0 showed massive corrosion in optical images: FIG. 2b (Sample 5B: $H_2SO_4$), FIG. 2d (Sample 5C: HCl) and FIG. 2c (Sample 5D: $HNO_3$). The corrosion defect pits/holes in Samples 5B, 5C, and 5D (FIGS. 2b-2d) are as big as 1 micron in diameter. Note that although optical images of only samples 5E (FIG. 2e: $H_3PO_4$) and 5F (FIG. 2f: acetic acid) are shown as representative examples, the Co surface post-polishing for all samples from 5E to 5J showed no Co corrosion, and would have similar optical images.

TABLE 5

Co corrosion Vs. polishing compositions containing different acid additives

| Sample | Acid additive | Acid additive pKa | Co corrosion |
| --- | --- | --- | --- |
| 5A, Control (Blanket Co Coupon) | None | None | No |
| 5B | $H_2SO_4$ | <0 | Yes |
| 5C | HCl | <0 | Yes |
| 5D | $HNO_3$ | <0 | Yes |
| 5E | $H_3PO_4$ | 2.12 | NO |
| 5F | Acetic acid | 4.75 | NO |
| 5G | Glycolic acid | 3.83 | NO |
| 5H | Malonic acid | 2.83 | NO |

TABLE 5-continued

Co corrosion Vs. polishing compositions containing different acid additives

| Sample | Acid additive | Acid additive pKa | Co corrosion |
|---|---|---|---|
| 5I | Propionic acid | 4.88 | NO |
| 5J | Citric acid | 3.08 | NO |

The results in Table 5 showed that Co corrosion occurred for polishing compositions containing strong acid additive with pKa<0. For polishing compositions containing weak acid (1<pKa<18), the etched Co coupon didn't show Co corrosion. For instance, polishing compositions containing any strong acid such as sulfuric acid, nitric acid or hydrochloric acid will cause severe Co corrosion (FIG. 2). However, polishing compositions containing weak acid additive such as phosphoric acid, acetic acid, glycolic acid, malonic acid, propionic aicd, or citric acid didn't have Co corrosion issue (FIG. 2). Particularly, the type of Co corrosion here refers to pit corrosion.

Example 2

This example demonstrates how Co corrosion is related to sulfate/chloride (or any other halide) anion concentration in the polishing compositions.

Sulfate/chloride anion concentrations are accurately measured using an ion chromatography (IC), commercially available from Thermo scientific Dionex as IC-5000 model. Other similar IC tools can also be used to quantify sulfate/chloride anion concentration in the polishing compositions. Although sulfate or chloride ions were not intentionally added to the control slurry, the impurity in the raw materials might contribute to ppm levels of sulfate/chloride in the polishing compositions. For this example/study, for some compositions, we increased the sulfate or chloride ions in the slurries by intentionally adding sulfuric acid or hydrochloric acid to the control polishing compositions so that there is in-situ generation of sulfate or chloride anions. All the sulfate/chloride concentrations listed in Table 6 were measured by Thermo Dionex IC-5000 IC tool. FIGS. 3a-3k and FIG. 4a-4k show images of Co coupons after etching by slurries containing different amounts of sulfate or chloride ions, respectively.

As shown in FIGS. 3a-3k, FIGS. 4a-4k, and Table 6, severe Co corrosion occurs when sulfate or chloride concentrations are greater than about 100 ppm individually, based on the total weight of the polishing composition. This 100 ppm threshold limit is based on the total weight of the above-described composition. The composition of the present disclosure can be diluted at the point of use (POU). For example, for a composition that is diluted 10× at the POU, the POU concentration threshold limit should be 10 ppm individually for the sulfate or halide ion. When the sulfate or chloride (a halide) concentrations are less than 100 ppm in the composition of the present disclosure, no Co corrosion was observed under an optical microscope. As previously discussed, sulfate or halide ions can come from raw materials or certain additives, but the total amount existing in the composition from all sources needs to be no more than about 100 ppm individually of each component, for preventing Co corrosion.

Since it can be diluted at the point of use (POU), the composition of the present disclosure can also be referred to as a polishing "concentrate". The product is typically sold as a "concentrate", and customers dilute the supplied concentrate at POU. This means that the compositions or concentrates of the present disclosure can be diluted at the (POU) (i.e., before going on the polishing tool) without changing the CMP performance. For example, the concentrate polishing composition can be diluted 2× or more at the POU, to form a POU polishing composition. The amounts of abrasive, RRE, CI, and pH adjustor will be present in amounts in the POU composition that are proportional to the dilution ratio, but there is no deterioration in performance of the POU composition. Water and/or an oxidizer (e.g., hydrogen peroxide or ammonium persulfate) can be added at the POU to achieve the desired dilution ratio. For Co slurries, the oxidizer can be added at POU, such that at the POU level, the oxidizer concentration is about 0.0001 wt % to about 5 wt %, based on the total weight of the POU polishing slurry.

As seen in Table 6 below, strong acids with negative pKa values will not cause Co corrosion at very low concentrations. However, the amount of the acids that would be present at these very low concentrations would be below the amount needed to effectively remove material from the substrate that is being polished. Thus, these strong acids are not suitable for use in the compositions of the present disclosure, even at very low concentrations that don't cause Co corrosion.

TABLE 6

Co Corrosion vs. sulfate or chloride concentration

| Acid additive | Sample | Sulfate ($SO_4^{2-}$)/ppm | Chloride ion ($Cl^-$)/ppm | Co Corrosion |
|---|---|---|---|---|
| None | Control | 4 | 1 | No |
| $H_2SO_4$ | 6A | 1000 | 1 | Yes |
| | 6B | 800 | 1 | Yes |
| | 6C | 600 | 1 | Yes |
| | 6D | 500 | 1 | Yes |
| | 6E | 400 | 1 | Yes |
| | 6F | 300 | 1 | Yes |
| | 6G | 200 | 1 | Yes |
| | 6H | 100 | 1 | Yes |
| | 6I | 50 | 1 | No |
| | 6J | 25 | 1 | NO |
| HCl | 6K | 4 | 1000 | Yes |
| | 6L | 4 | 800 | Yes |
| | 6M | 4 | 600 | Yes |
| | 6N | 4 | 500 | Yes |
| | 6O | 4 | 400 | Yes |
| | 6P | 4 | 300 | Yes |
| | 6Q | 4 | 200 | Yes |
| | 6R | 4 | 100 | Yes |
| | 6S | 4 | 50 | No |
| | 6T | 4 | 25 | NO |

Example 3

This example shows Co removal rate and SER of one optimized polishing composition. The polishing composition comprised silica particles, RRE and CI with 1<pKa<18 with a pH in the range of 7-12. The sulfate or chloride ions in the polishing composition are less than 100 ppm as confirmed by IC measurements. The silica particle can be synthesized using sol-gel method or purchased from commercial particle suppliers such as Evonik Industries of Germany, Nalco Company of USA, or Fuso Chemical Co., Ltd. of Japan. An Applied Materials Mirra 200 mm CMP polishing tool was used to polish Co films at 1.5 psi using the inventive polishing composition.

The polishing composition had very high Co RR of ~5000 A/min and very low SER of ~10 A/min at 40° C. (FIGS. 5a -5b). The optical images (OM) of Co wafers (FIG. 5b) showed that no Co corrosion was occurring post-CMP, using the optimized polishing compositions. This is very important for Co planarization in CMP, where it is often desired to use a Co slurry with a high RR while not having Co corrosion issues.

Example 4

Figure 6A:
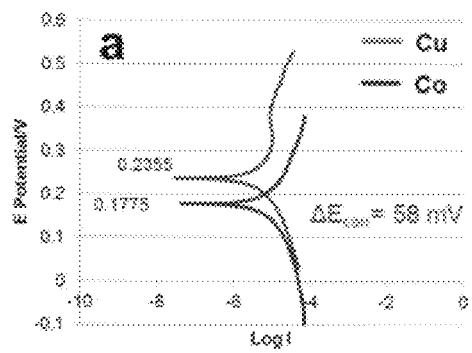
FIGS. 6a and 6b show Tafel plots for Cu and Co in different polishing compositions: a) polishing composition containing 600 ppm Sulfate ions; b) polishing compositions having less than 100 ppm sulfate ions and RREs, CI and pH adjuster according to the present disclosure.
Figure 6B:
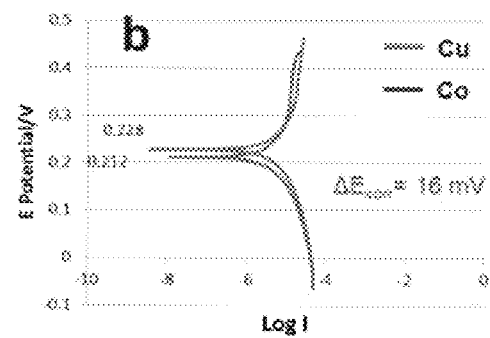

This example shows the impact of acid additives on Corrosion potential difference ($\Delta E_{corr}$) between Co and Cu. It is well known that galvanic corrosion occurs when two dissimilar metals are in electrical contact in the presence of an electrolyte. The more active metal will be corroded and more noble metal will get protected from Galvanic corrosion. As Co is naturally more chemically reactive that Cu, for integrations involving both Cu and Co metals, the CMP processes for such integrations are challenging due to the galvanic corrosion of Co. To minimize or avoid galvanic corrosion, it is desired to reduce $\Delta E_{corr}$ between Co and Cu to less than 30 mV. This could be achieved by eliminating the strong acid additive (with pKa<1) in the slurry formulations. $E_{corr}$ in a polishing composition can be measured by Tafel plot using electrochemical tool from commercial suppliers such as Princeton Applied Research. As shown by FIGS. 6a and 6b, $\Delta E_{corr}$ between Co and Cu is larger than 30 mV for polishing compositions containing sulfate additives whereas a much lower $\Delta E_{corr}$ of less than 30 mV is obtained using polishing compositions having sulfate or chloride additive less than 100 ppm and RRE, CI and pH adjuster with pKa in the 1<pKa<18 range. This example demonstrates that galvanic corrosion between Cu and Co can be prevented by using the inventive polishing compositions having sulfate or chloride ions less than 100 ppm and with RRE, CI and pH adjuster with pKa in the 1-18 range.

Example 5

In most CMP processes, it is desirable that a polishing composition (slurry) can polish multiple films (metals, dielectrics, etc.) at the same time, and at varying polishing rates. The ratio of the polishing rates of different materials polished by the slurry is known as the selectivity of the slurry. For example, a Cu slurry may need to polish Cu films at high MRRs and Ta/TaN films at low (and near to zero) MRRs. Such a Cu slurry would be called a Cu selective slurry (selective to Cu removal vs. Ta/TaN). This example shows that the inventive polishing compositions discussed in this disclosure can also be used for polishing other materials such as TiN, Ti, Ta, TaN, SiN, TEOS, polysilicon (poly-Si) with different selectivity to Co films. The polishing composition here contains silica abrasive, RRE, azole based corrosion inhibitor, and acid additives as pH adjuster, with all components having pKa in 1-18 range, and with pH of the slurry in the range of 7-12. Additionally, the slurry has much less than 100 ppm of sulfate and halide ions, as analyzed by IC. The slurry was polished on different blanket films as shown in Table 7 using Applied Materials' Mirra 200 mm CMP polishing tool. The polishing compositions here had very high selectivity of Co to Ta, TaN, Ti, SiN, TEOS, and poly-Si of greater than 300:1 (table 7), indicating these materials can be used as additional stopping layer or capping materials for Co applications. As for low/moderate selectivity requirements, TiN can be used as the additional liner for Co applications (Co: TiN of 9.4), and the inventive polishing compositions can be used in this application to remove both Co and TiN simultaneously, at varying rates.

TABLE 7

Co RR Vs. Other metal or dielectric films RR

| Films | Normalized RR | RR selectivity (Co: other film) |
|---|---|---|
| Co | 77.09 | |
| Ta | 0.15 | >500 |
| TaN | ~0 | >500 |
| Ti | 0.07 | >500 |
| TiN | 8.18 | 9.4 |
| SiN | 0.1 | >500 |
| TEOS | 0.22 | 354 |
| Poly-Si | 0.14 | >500 |

Example 6

Figure 7A:
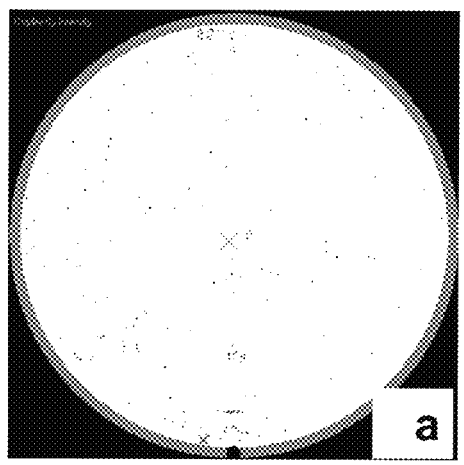
FIGS. 7a and 7b show (a) very low defectivity and (b) corrosion-free Co film surfaces post-polishing using the polishing composition of the present disclosure.
Figure 7B:
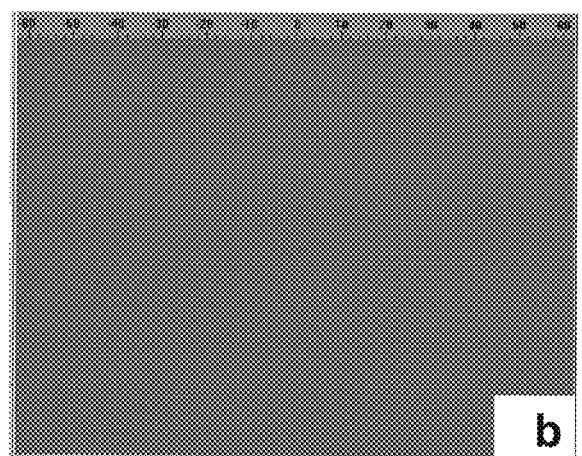

Defectivity is an important parameter during the chip manufacturing process, and it is preferred to have very low defectivity in every step of CMP so as to have high yield of chip dies. For metal CMP slurry, defectivity can come from corrosion, scratches, polishing byproducts/residues, high Large Particle Counts (LPCs), and particles. It is very difficult to keep the total defectivity counts below 500 since many factors can generate defects. This example demonstrates that the inventive polishing compositions display extremely low total defectivity counts. The polishing compositions contains silica abrasive, azole based CI, and RRE/weak acid with pKa in the range of 1-18, and no sulfate or chloride ions added intentionally (4 ppm sulfate ion and 1 ppm chloride ions were coming from raw materials as determined by IC). The polishing composition was used to polish the Co wafers on Applied Materials Mirra 200 mm CMP polishing tool. The polished wafers were cleaned with alkaline cleaner and scanned under AIT (KLA-Tencor XUV) tool to generate total defectivity counts and defect maps. For one inventive polishing composition, the total defectivity counts are only approximately 300. The defect map (FIG. 7a), and enlarged "smaller area focused" mode (FIG. 7b) also showed that no scratches or severe corrosion was present on the polished wafer surface. This low defectivity result of the inventive polishing compositions again demonstrates the benefit of the synergistic effects of eliminating corrosion inducing agents such as sulfate or halides in the polishing composition and using optimized corrosion inhibitor system for Co protection.

While the present disclosure has been described with reference to one or more exemplary embodiments, it will be understood by those skilled in the art that various changes may be made and equivalents may be substituted for elements thereof without departing from the scope of the present disclosure. Variations of the preferred embodiments mentioned herein may become apparent to those of ordinary skill in the art upon reading the foregoing descriptions. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims. Furthermore, the inventors expect skilled artisans to employ variations as appropriate to practice the disclosure in other forms than as specifically described herein. This includes all modifications and equivalents of the subject matter recited in the claims appended hereto as permitted by applicable law.

What is claimed:

1. A polishing method, comprising:
applying a polishing composition to a substrate having cobalt on its surface; and
removing at least a portion of the cobalt from the substrate at a first rate, by bringing a pad into contact with the substrate and moving the pad in relation to the substrate,
wherein the composition comprises:
a) an abrasive;
b) a weak acid removal rate enhancer;
c) an azole-containing corrosion inhibitor; and
d) a pH adjuster;
wherein said removal rate enhancer, said corrosion inhibitor, and said pH adjuster each have a pKa between 1 and 18, and
wherein the pH of the composition is between 7 and 12, and
wherein the composition has less than about 100 parts per million of sulfate ions and less than about 100 parts per million of halide ions, each based on the total weight of the composition.

2. The method of claim 1, wherein the substrate further comprises at least one of silicon oxide, silicon nitride, metal oxide, low/ultra-low k dielectric films, and/or polysilicon on the surface, and the method further comprises:
removing said at least one of dielectric and/or metal oxide at a second rate, wherein said first rate is greater than or equal to said second rate.

3. The method of claim 2, wherein the substrate further comprises at least one other dielectric film such as silicon oxide, silicon nitride, low/ultra-low k dielectric films, and/or polysilicon on the surface, and the method further comprises:
removing said at least one of dielectric film at a third rate, wherein said first and second rates are at least 5× greater than the said third rate, and said third rate is less than 100 A/min.

4. The method of claim 1, wherein said abrasive is selected from the group consisting of alumina, silica, titania, ceria, zirconia, co-formed products thereof, coated abrasives, surface modified abrasives, and mixtures thereof.

5. The method of claim 1, wherein said removal rate enhancer is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, potassium acetate, potassium citrate, amino acetic acid, phenoxyacetic acid, bicine, phosphoric acid, diglycolic acid, glyceric acid, tricine, alanine, histidine, valine, phenylalanine, proline, glutamine, aspartic acid, glutamic acid, arginine, lysine, tyrosine, benzoic acid, salts thereof, and mixtures thereof.

6. The method of claim 1, wherein the azole-containing corrosion inhibitor is selected from the group consisting of triazole, tetrazole, benzotriazole, tolytriazole, aminotriazole, aminobenzimidazole, pyrazole, imidazole, aminotetrazole, and mixtures thereof.

7. The method of claim 1, wherein the abrasive is present in an amount of about 0.05 to about 15 percent by weight, based on the total weight of the composition.

8. The method of claim 1, wherein said removal rate enhancer is present in amount of about 0.1 to about 20 percent by weight, based on the total weight of the composition.

9. The method of claim 1, wherein said corrosion inhibitor is present in an amount of about 0.05 to about 10 percent by weight, based on the total weight of the composition.

10. The method of claim 1, wherein said pKa of said removal rate enhancer, said corrosion inhibitor, and said pH adjuster is between 2 and 10.

11. The method of claim 10, wherein the composition has less than about 50 parts per million (ppm) of sulfate ions and less than about 50 ppm of halide ions.

12. The method of claim 1, wherein the pH adjuster is a weak acid selected from the group consisting of citric acid, tartaric acid, malic acid, glycolic acid, malonic acid, oxalic acid, acetic acid, propionic acid, peracetic acid, succinic acid, lactic acid, potassium acetate, potassium citrate, and combinations thereof.

13. The method of claim 1, wherein the corrosion potential difference ($\Delta E_{corr}$) between Cu and Co in potentiodynamic Tafel plots is less than 30 mV ($\Delta E_{corr}$<30 mV).

14. The method of claim 1, further comprising the step of adding an oxidizer to the polishing composition, either before or concurrently with said applying step.

15. The method of claim 14, wherein said oxidizer is hydrogen peroxide, ammonium persulfate, or a combination thereof.

16. The method of claim 14, wherein said oxidizer is present in the point of use polishing slurry in an amount of about 0.0001 wt % to about 5 wt %, based on the total weight of the polishing slurry.

17. A polishing method, comprising:
applying a polishing composition to a substrate having cobalt on its surface; and
removing at least a portion of the cobalt from the substrate at a first rate, by bringing a pad into contact with the substrate and moving the pad in relation to the substrate,
wherein the composition comprises:
a) an abrasive, wherein said abrasive is selected from the group consisting of silica, titania, ceria, zirconia, and mixtures thereof;
b) a weak acid removal rate enhancer;
c) an azole-containing corrosion inhibitor; and
d) a pH adjuster;
wherein said removal rate enhancer, said corrosion inhibitor, and said pH adjuster each have a pKa between 1 and 18, and
wherein the pH of the composition is between 7 and 12, and
wherein the composition has less than about 100 parts per million of sulfate ions and less than about 100 parts per million of halide ions, each based on the total weight of the composition.

* * * * *